US008098002B2

(12) United States Patent
Baborowski et al.

(10) Patent No.: US 8,098,002 B2
(45) Date of Patent: Jan. 17, 2012

(54) SILICON RESONATOR OF THE TUNING-FORK TYPE

(75) Inventors: Jacek Baborowski, Lussery Villars (PL); Claude Bourgeois, Bole (CH); Marc-Alexandre Dubois, Apples (CH); David Ruffieux, Lugnorre (CH)

(73) Assignee: CSEM Centre Suisse d'Electronique et de Microtechnique SA Recherche et Developpement, Neuchatel (CH)

( * ) Notice: Subject to any disclaimer, the term of this patent is extended or adjusted under 35 U.S.C. 154(b) by 386 days.

(21) Appl. No.: 12/444,846

(22) PCT Filed: Oct. 8, 2007

(86) PCT No.: PCT/EP2007/060641
§ 371 (c)(1), (2), (4) Date: Apr. 9, 2009

(87) PCT Pub. No.: WO2008/043727
PCT Pub. Date: Apr. 17, 2008

(65) Prior Publication Data

US 2010/0013360 A1 Jan. 21, 2010

(30) Foreign Application Priority Data

Oct. 9, 2006 (CH) ...................................... 1606/06

(51) Int. Cl.
*H03H 9/19* (2006.01)

(52) U.S. Cl. ....................................................... 310/370

(58) Field of Classification Search .................. 310/370
See application file for complete search history.

(56) References Cited

U.S. PATENT DOCUMENTS 5,438,231 A * 8/1995 Khoshnevisan et al. ...... 310/321
6,931,927 B2 8/2005 Ohta et al.
7,002,284 B2 * 2/2006 Ouchi et al. .................. 310/370
7,164,179 B2 * 1/2007 Nakanishi et al. ............ 257/414
7,441,459 B2 * 10/2008 Ohuchi et al. ............ 73/504.16
7,745,975 B2 * 6/2010 Asai et al. ..................... 310/331

FOREIGN PATENT DOCUMENTS

EP 1 083 404 3/2001
EP 1 403 616 3/2004
JP 57-183116 11/1982
JP 58-003411 1/1983
JP 59-171303 9/1984

(Continued)

OTHER PUBLICATIONS

B. S. Berry et al., "Temperature Compensation for Constant Frequency Electrochemical Oscillators", Sep. 1971, IBM Technical Disclosure Bulletin, vol. 4, No. 4, Sep. 1974, XP002462194, pp. 1237-1238.

(Continued)

*Primary Examiner* — Jaydi San Martin
(74) *Attorney, Agent, or Firm* — Young & Thompson

(57) ABSTRACT

The invention relates to a silicon resonator (10) of the tuning-fork type in which the linear frequency drift depending on the temperature is compensated. The resonator includes a silicon base (14), a plurality of parallel arms (11, 12, 13) capable of vibrating and actuator (18, 21, 22), wherein the arms include a silicon layer provided between two layers of silicon oxide having a thickness, relative to that of the silicon layer, such that it ensures the first-order compensation of the resonator thermal drift.

14 Claims, 1 Drawing Sheet

FOREIGN PATENT DOCUMENTS

Figure 1:
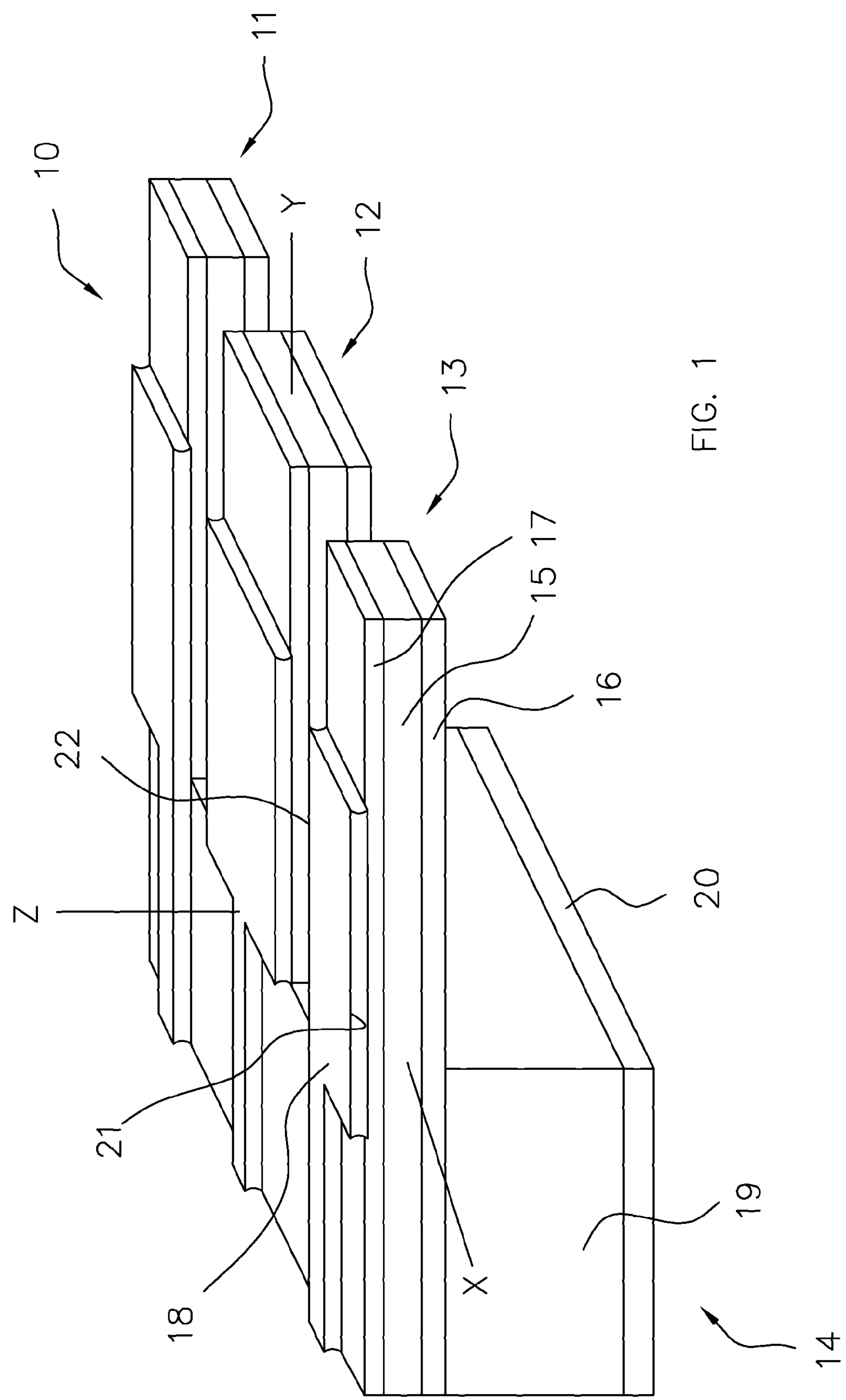

| | | | | |
|---|---|---|---|---|
| JP | 10197254 | A | * | 7/1998 |
| JP | 2002022445 | A | * | 1/2002 |
| JP | 2005274360 | A | * | 10/2005 |
| JP | 2006038717 | A | * | 2/2006 |
| JP | 2009005022 | A | * | 1/2009 |
| WO | 98/29943 | | | 7/1998 |
| WO | 2004/095696 | | | 11/2004 |
| WO | WO 2010007184 | A1 | * | 1/2010 |

OTHER PUBLICATIONS

M. Esashi et al., "Packaged Micromechanical Sensors", Emerging Technologies and Factory Automation, 1994, ETFA '94, IEEE Symposium on Tokyo, Japan Nov. 6-10, 1994, New York, NY, USA, IEEE< 6, Nov. 1994, XP010139977, pp. 30-37.

M. F. Hribsek, "Electromechanical Beam Filter Bank", Microelectronics Journal, Mackintosh Publications Ltd., Luton. GB, vol. 27, No. 6, Sep. 1996, XP004007231, pp. 523-530.

C. Bourgeois et al., "Design of Resonators for the Determination of the Temperature Coefficients of Elastics Constants of Monocrystalline Silicon," Frequency Control Symposium, 1997, Proceedings of the 1997 IEEE International Orlando, FL, USA, May 28-30, 1997, New York, NY, USA, IEEE, US, May 28, 1997, XP010257368, pp. 791-799.

M. Abe et al., "Trident-type Tuning Fork Silicon Gyroscope by the Phase Difference Detection", IEEE, Jan. 23, 2000, XP010377179, pp. 508-513.

Wan-Thai Hsu et al., Mechanically Temperature-Compensated Flexural-Mode Micromechanical Resonators, Center Integrated Micro Systems, Department of Electrical Engineering and Computer Science University of Michigan, Ann Arbor, MI, 2000, IEEE, pp. 399-402.

Wan-Thai Hsu et al., "Stiffness-Compensated Temperature-Insensitive Micromechanical Resonators", Center for Wireless Integrated Microsystems Department of Electrical Engineering and Computer Science, University of Michigan, Ann Arbor MI, 2000, IEEE, pp. 731-734.

M Hopcroft et al., "Active Temperature Compensation for Micromachined Resonators", Solid-State Sensor, Actuator and Microsystems Workshop Hilton Head Island, South Carolina, Jun. 6-10, 2004, pp. 364-367.

International Search Report dated Mar. 10, 2008, from corresponding PCT application.

* cited by examiner 10
11
12
13
Y
Z
X
15
16
17
18
19
20
21
22
14

SILICON RESONATOR OF THE TUNING-FORK TYPE

TECHNICAL FIELD

The invention relates to a silicon resonator of the tuning-fork type. It more particularly relates to a resonator of this type, for which the linear drift of frequency versus temperature is compensated.

Presently, there is strong demand for resonating structures (acoustic resonators, sensors, oscillating structures) made in silicon because of the compatibility with integrated circuits and their capability of miniaturization. Many solutions have been proposed up to now, which resort to different types of resonator geometry and to different actuation modes.

In the known structures of MEMS (Micro-Electro-Mechanical System) resonators, activation is most often produced by electrostatic coupling, which requires relatively high voltages whether they are DC or AC voltages. The main drawback of known resonators is that because of the intrinsic thermal drift of silicon, the behavior of these MEMS is very dependent on the operating temperature of these devices. For a good number of applications, this behavior is not acceptable and should be compensated in any way or another.

STATE OF THE ART

The literature mentions various types of thermal compensation comprising i.a. compensation achieved at the oscillator on the basis of information provided by an integrated thermometer. This method requires individual calibration of the devices and in addition to the cumbersomeness of the method, the stability of the thermal compensation is directly related to the stability of the integrated thermometer which sometimes does not satisfy the requisite requirements. Further, with this type of compensation, the frequency drawing range of the resonator is most often too limited for the contemplated application. Other methods suggest acting on the constraints internal to the resonators (“Mechanically Temperature-Compensated Flexural-Mode Micromechanical Resonators”, Wan-Thai Hsu et al., IEEE 2000), modifying the stiffness of the substrate (“Stiffness-Compensated Temperature-Insensitive Micromechanical Resonators”, Wan-Thai Hsu et al., IEEE 2002) or even adjusting the operating temperature of the resonator (“Active Temperature Compensation for Micromachined Resonators”, M. Hopcroft et al., Solid-State Sensor, Actuator and Microsystems Workshop, Hilton Head Island, S.C., Jun. 6-10, 2004).

However, the resonators obtained according to these methods do not meet the whole of the criteria: low bulkiness, low cost, low consumption and easy to manufacture.

Further, the possibility of using a resonator having a composite structure based on silicon, allowing compensation of its thermal drift, is known from document WO 98/29943. The proposed resonator is a film comprising a first silicon layer and at least one second layer in silicon oxide or nitride. The film is tensioned through both of its ends on supports. The expansion difference between both materials used, when the resonator undergoes a change in temperature, causes a variation of the tension of the resonator between both supports, so that the resonance frequency of the resonator is substantially stable versus temperature. In fact, this method necessarily implies that both ends of the resonator are attached so that its tension may be varied, as for a guitar string.

DISCLOSURE OF THE INVENTION

In order to solve these problems, the invention proposes a resonator of the type described earlier including a stand or base in silicon, a plurality of parallel arms extending from the base and capable of vibrating, and actuation means for exciting the vibration of the arms, the resonator being characterized in that said arms comprise in the direction of their thickness, a silicon layer and at least one silicon oxide layer, the thickness of which relatively to that of the silicon layer is such that it allows first order compensation of the thermal drift of the resonator.

According to other features of the invention:

- the silicon layer is comprised between two silicon oxide layers;
- the actuation means comprise a piezoelectric layer deposited on at least one portion of the arms;
- the piezoelectric layer is in aluminum nitride;
- the arms are 3 in number, the inner arm being about twice as wide as the outer arms;
- the arms are set into vibration according to an out-of-plane flexural mode, the outer arms vibrating in phase opposition relatively to the central arm;
- the flexural mode is coupled to an in-plane elongational mode;
- the actuation means are of the electrostatic type;
- the vibration mode is an in-plane flexural mode.

The invention also relates to methods with which resonators according to the invention may be made.

SHORT DESCRIPTION OF THE DRAWING

Other features and advantages of the invention will become apparent upon reading the detailed description which follows for the understanding of which reference will be made to the appended FIG. 1 which is a perspective view which illustrates a resonator as a three-arm tuning fork made according to the teachings of the invention.

EMBODIMENT(S) OF THE INVENTION

For the following description, transverse “X” and longitudinal “Y” orientations will be adopted as well as a normal axis “Z” perpendicular to the longitudinal and transverse orientations. These orientations are indicated by the axes “X, Y, Z” of FIG. 1, respectively.

In FIG. 1 a resonator 10 is illustrated which includes three arms capable of being set into vibration via aluminum nitride layers (AlN) positioned on their upper faces.

The resonator 10 has the shape of a tuning fork with three arms which includes a stand or base 14 from which extend three parallel arms 11, 12 and 13. The actual base 14 is for the major part in silicon 19. On its upper face, it has the same structure as that of the arms and, on its lower face, it may exhibit a silicon oxide layer ($SiO_2$) due to the method.

Each of the arms has a central portion 15 in silicon set between two layers 16 and 17 of silicon oxide ($SiO_2$). According to one alternative of the invention, the arms only include a portion in silicon and a single oxide layer made on the lower or upper face of the portion in silicon.

Each of the arms further includes a piezoelectric layer 18, deposited on a portion of their length close to the base and made in aluminum nitride, this layer allowing the arms to be excited by electronic means well-known to one skilled in the art. As aluminum nitride is four times stiffer than silicon oxide, it is preferable that the AlN layer only occupy a very small portion of the arms capable of vibrating. In order to be excited, the AlN layer is set between two electrodes, one lower one 21 on the $SiO_2$ layer 17 and the other upper one 22 on the AlN layer.

The central arm has a width equal to about twice the outer arms.

The excitation of the arms is accomplished so that the arms vibrate in flexure out of the plane (X-Y) formed by the latter at rest and the vibrations of the outer arms are in phase opposition with those of the inner arm. In this way, the displacement of the masses is compensated, which makes the resonator less sensitive to acceleration effects and increases its quality factor.

On the resonators made, it was observed that the out-of-plane flexural vibration mode is coupled with an elongation mode of the arms in the plane (X-Y). As this latter mode has a significantly higher vibration frequency than the flexural vibration mode, it is easily suppressed by the oscillator to which the resonator is connected while operating.

The thickness of the $SiO_2$ layer on each of the arms relatively to that of the Si layer is such that the first order of thermal drift may be cancelled out. Indeed, the drifts of Si and $SiO_2$ depending on the temperature act in an opposite way. More specifically, the first thermal coefficients of the stiffness of both of these materials are of opposite signs. In this way, a given change in temperature induces a certain variation in the stiffness of the $SiO_2$ layer and a variation in the opposite direction of the stiffness of the $SiO_2$ layer. The relative thicknesses of the Si and $SiO_2$ layers allow the stiffness variations of both layers to be compensated. Thus, as an example, for a Si thickness of 25 microns, a $SiO_2$ thickness of 5 microns on each face of the arm already allows cancellation of the linear drift or, at the very least, very strong reduction thereof. Thus, it was already possible to show that it may be reduced by at least 1 ppm (parts per million or $10^{-6}$) per degree. Obviously, if, in order to obtain a same effect, the arm only includes one single $SiO_2$ layer located under or on the silicon layer, its thickness will be approximately larger than in the case when the arm includes two layers.

A compensation of the second and third order of thermal drift may if necessary be accomplished by conventional means, for example via an electronic route.

The resonance frequency is mainly set by the dimensions of the resonator, and may be easily set in a range from a few ten to a few hundred kHz, or even to several MHz.

As an example, a resonator vibrating at 32 kHz has a length of 1.2 mm and an overall width of about 1 mm. The widths of the arms are 200 and 400 microns respectively, their thickness, 25 microns. The distance between the arms is 50 microns. The base has a thickness of 380 microns.

The making of resonators as basically described above, is achieved starting with silicon-on-insulator wafers (SOI, Silicon On Insulator) which have a thick silicon base, including a thin layer of $SiO_2$ on which a thin layer of silicon is made. The layers of $SiO_2$ and of silicon have the thicknesses required for making the arms of the resonator.

The term of thick describing the base is essentially relative to the thin layers of $SiO_2$ and silicon. In practice, the thickness of the base is sufficient for the making of the base of the resonator, i.e. so that the latter is particularly stiff so that better evanescence of the vibration modes and, subsequently, a high quality factor may be obtained.

With respect to the crystallographic axes of the wafer, the longitudinal axis of the resonator 10 will be oriented along one of the <100> or <110> directions, the latter orientation being however preferred.

The first step is a step for oxidizing the wafer on both of its faces. One of these oxide layers ($SiO_2$) form the upper layer 17 of the arms and the other one the layer 20 of the base 14.

After oxidization, the actuation means of the arms are formed. A layer of metal, for example platinum (Pt), is deposited by sputtering or evaporation, on the whole upper surface of $SiO_2$ and then structured so as to assume the shape of the resonator. Platinum was selected because this metal guarantees optimum crystallographic orientation of AlN.

The next step is the deposit of the AlN layer by sputtering and then on this layer the upper electrode is deposited, which may be in Pt, Al, AlSi, etc. This upper electrode is then structured in order to correspond to the actuation area. An aperture is made in the AlN layer in order to be able to establish an electric contact with the lower electrode.

The shape of the resonator is then defined by plasma etching. Next, the rear face of the wafer is etched, also by plasma, in order to remove the silicon under the arms. Etching is stopped at the thin layers of $SiO_2$.

The arms are then released by etching of silicon and of $SiO_2$ between the arms.

According to a less performing but nevertheless feasible alternative, the starting SOI of the manufacturing method above may only be oxidized at its lower face, i.e. on its face defined by the thick silicon base. In practice, it may be preferable to oxidize SOI on both of its faces and to remove the upper $SiO_2$ layer, i.e. the one located on the side of the thin silicon layer.

Next, as described for the manufacturing method above, the actuation means of the arms are formed by depositing on the upper face of the wafer located on the side of the thin silicon layer, a piezoelectric layer between both electrodes.

Finally, the obtained assembly is etched in order to give it the shape of the resonator and to form the arms. It will be noted that, at the arms, etching is stopped on the side of the lower face of the wafer, at the thin $SiO_2$ layer. The arms thus include a lower $SiO_2$ layer and an upper silicon layer bearing the actuation means.

In another alternative manufacturing method, one starts with a thick single wafer, i.e. the thickness of which is sufficient for making the base of the resonator. The wafer is oxidized on both of its faces in order to form an upper $SiO_2$ layer and a lower $SiO_2$ layer.

Next, as described for the manufacturing method above, the actuation means of the arms are formed by depositing on one of the faces of the wafer, a piezoelectric layer between two electrodes.

Finally, the obtained assembly is etched in order to give it the shape of the resonator and to form the arms. It will be noted that at the arms, on the side of the lower face not including the piezoelectric layer, etching is stopped in the wafer so as to form a thin silicon layer. The arms thus include a lower silicon layer and an upper $SiO_2$ layer bearing the actuation means.

Generally, it will be noted that the lower $SiO_2$ layer, i.e. the one not bearing the actuation means, is not indispensable.

Although a resonator with 3 arms has been described, a number of arms of more than 3, for example 4, 5, etc., may be contemplated. With 4 arms, the both central arms will be in phase relatively to each other and in phase opposition relatively to the outer arms.

The preferential vibration mode is the out-of-plane flexural mode; this is the easiest mode to be excited and therefore only requires a small thickness of the piezoelectric AlN layer. This flexural mode is also the lowest frequency mode and therefore the mode which is the less perturbed by the other modes.

However, other modes may be used, such as an in-plane flexural mode (along the direction X) of the outer arms or even an elongational mode of the arms. The shape of the electrodes will then be adapted to the selected mode of vibration. It was seen earlier that this mode was coupled to the out-of-plane flexural mode but the selection of the elongational mode will depend on the oscillator used.

Finally, the resonator of the invention may no longer be excited by means of a piezoelectric layer but by an actuation of the electrostatic type. The latter is not preferred as it is more difficult to apply; the distances between electrodes have to be carefully controlled and depending on the embodiments, one may be confronted with sticking problems.

By using silicon wafers (SOI) it is possible to contemplate the making of the resonator and of its electronics on the same chip. Indeed, the method for making the resonator is a method at a relatively low temperature and is compatible with methods of microelectronics.

The invention claimed is:

1. A resonator of the tuning-fork type in silicon including:

a stand or base in silicon, three parallel arms defining an inner arm and two outer arms, said inner arm being about twice as wide as the outer arms, said arms extending from the base and capable of vibrating, actuation means for exciting the vibration of said arms, said arms comprising in the direction of their thickness, a silicon layer and at least one layer of silicon oxide, the thickness of which, relatively to that of the silicon layer, is such that it allows first order compensation of the thermal drift of the resonator.

2. The resonator as claimed in claim 1, wherein said silicon layer is comprised between a first and a second silicon oxide layers.

3. The resonator as claimed in claim 2, wherein the actuation means comprise a piezoelectric layer deposited on at least one portion of the arms, said piezoelectric layer being comprised between two electrodes.

4. The resonator as claimed in claim 2, wherein said actuation means are of the electrostatic type.

5. The resonator as claimed in claim 1, wherein the actuation means comprise a piezoelectric layer deposited on at least one portion of the arms, said piezoelectric layer being comprised between two electrodes.

6. The resonator as claimed in claim 5, wherein said piezoelectric layer is in aluminum nitride.

7. The resonator as claimed in claim 1, wherein the vibration of the arms is a out-of-plane flexural mode and the outer arms vibrate in phase opposition relatively to the central arm.

8. The resonator as claimed in claim 1, wherein said actuation means are of the electrostatic type.

9. The resonator as claimed in claim 1, characterized in that the vibration mode is an in-plane flexural mode.

10. A method for first order compensation of the thermal drift of a resonator of the tuning-fork type in silicon including:

a stand or base in silicon, three parallel arms defining an inner arm and two outer arms, said inner arm being about twice as wide as the outer arms, said arms extending from the base and capable of vibrating, actuation means for exciting the vibration of said arms, comprising the arrangement of a silicon layer and of at least one silicon oxide layer on said arms, in the direction of their thickness, the thickness of said silicon and silicon oxide layers relatively to the silicon layer being such that it allows first order compensation of the thermal drift of the resonator.

11. The method according to claim 10, wherein said silicon layer is comprised between a first and a second silicon layers.

12. A method for making a resonator of the tuning-fork type in silicon, the thermal drift of which is compensated to the first order, said resonator including:

a stand or base in silicon, three parallel arms defining an inner arm and two outer arms, said inner arm being about twice as wide as the outer arms, said arms extending from the base and capable of vibrating, actuation means for exciting the vibration of said arms, said method consisting of making the arms so that the latter include a silicon layer and an $SiO_2$ layer positioned on the arms and/or an $SiO_2$ layer positioned under the arms, the thicknesses of the silicon layer and of the $SiO_2$ layer(s) being determined for first order compensation of the thermal drift of the resonator.

13. The method according to claim 12, including the steps of:

i. providing a wafer including a thick silicon base, a thin $SiO_2$ layer positioned on the thick layer and on which a thin silicon layer is made, the thin $SiO_2$ and silicon layers having the required thicknesses for making said arms, ii. oxidizing the wafer on at least its upper face, located on the side of the thin silicon layer so as to form an upper $SiO_2$ layer, iii. depositing on the upper face of the wafer, a piezoelectric layer between two electrodes in order to form the actuation means, and iv. etching the obtained assembly in order to give it the shape of the resonator and to form the arms, etching being stopped on the side of the lower face of the wafer at the arms, at said thin $SiO_2$ layer.

14. The method according to claim 12, including the steps of:

i. providing a thick silicon wafer, ii. oxidizing the wafer on at least one of both of its faces so as to form an $SiO_2$ layer, iii. depositing on the $SiO_2$ layer a piezoelectric layer between two electrodes in order to form the actuation means, iv. etching the obtained assembly in order to give it the shape of the resonator and to form the arms, etching being stopped on the side of the face not including the piezoelectric layer, at the arms so as to form a thin silicon layer.

* * * * *